United States Patent
Cheng et al.

(10) Patent No.: US 7,358,586 B2
(45) Date of Patent: Apr. 15, 2008

(54) SILICON-ON-INSULATOR WAFER HAVING REENTRANT SHAPE DIELECTRIC TRENCHES

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 10/951,745

(22) Filed: Sep. 28, 2004

(65) Prior Publication Data

US 2006/0071274 A1 Apr. 6, 2006

(51) Int. Cl.
*H01L 29/00* (2006.01)
*H01L 21/76* (2006.01)

(52) U.S. Cl. .............. 257/501; 257/506; 257/510; 438/404; 438/406

(58) Field of Classification Search ............ 438/404, 438/406, 424; 257/501, 510, 506
See application file for complete search history.

(56) References Cited

U.S. PATENT DOCUMENTS

| | | | |
|---|---|---|---|
| 4,829,018 A | 5/1989 | Wahlstrom | |
| 5,240,883 A | 8/1993 | Abe et al. | |
| 5,488,004 A | 1/1996 | Yang | |
| 5,591,678 A | 1/1997 | Bendik et al. | |
| 5,661,044 A | 8/1997 | Holland et al. | |
| 5,918,136 A | 6/1999 | Nakashima et al. | |
| 6,074,928 A | 6/2000 | Ogura | |
| 6,224,668 B1 | 5/2001 | Tamatsuka | |
| 6,245,645 B1 | 6/2001 | Mitani et al. | |
| 6,306,730 B2 | 10/2001 | Mitani et al. | |
| 6,358,816 B1* | 3/2002 | Singh et al. ............. | 438/424 |
| 6,433,401 B1 | 8/2002 | Clark et al. | |
| 6,465,319 B1 | 10/2002 | Lee et al. | |
| 6,492,209 B1 | 12/2002 | Krishnan et al. | |
| 6,537,861 B1 | 3/2003 | Kroell et al. | |
| 6,599,813 B2 | 7/2003 | Beyer et al. | |
| 6,884,693 B2* | 4/2005 | Yi ............................ | 438/406 |
| 2004/0040492 A1* | 3/2004 | Sakaguchi ................ | 117/84 |
| 2005/0285179 A1* | 12/2005 | Violette .................... | 257/315 |

* cited by examiner

*Primary Examiner*—Hsien-Ming Lee
(74) *Attorney, Agent, or Firm*—Kerry B. Goodwin; Daryl K. Neff

(57) ABSTRACT

A bonded SOI wafer and a method for forming a bonded SOI wafer are provided. According to the disclosed method, a first semiconductor wafer is provided, having a first dielectric layer disposed at an outer surface of the first wafer and a plurality of dielectric filled trenches extending from the outer surface inwardly into the semiconductor. The outer surface of the first wafer is bonded to the outer surface of a second semiconductor wafer to form a bonded wafer having a bulk semiconductor region, a buried dielectric layer overlying the bulk semiconductor region, and a semiconductor-on-insulator layer overlying the buried dielectric layer, with the dielectric filled trenches extending upwardly from the buried dielectric layer into the semiconductor-on-insulator layer. The thickness of the semiconductor-on-insulator layer is then reduced until uppermost surfaces of at least some of the dielectric filled trenches are at least partially exposed.

8 Claims, 7 Drawing Sheets

SILICON-ON-INSULATOR WAFER HAVING REENTRANT SHAPE DIELECTRIC TRENCHES

BACKGROUND OF THE INVENTION

The invention relates to semiconductor processing, and more particularly to a bonded silicon-on-insulator wafer structure and method for making the same.

Semiconductor-on-insulator (SOI) technology, particularly silicon-on-insulator technology, has found increased use recently for the improved circuit performance that it provides. In SOI technology, a wafer or other device substrate includes a thin SOI layer consisting essentially of a single crystal semiconductor, e.g., silicon, disposed as a top layer of the wafer. The SOI layer overlies a buried insulating layer, typically of oxide (a "buried oxide" or "BOX" layer), which, in turn, is disposed above a bulk layer of the substrate. Active devices including transistors, diodes and sometimes other devices are formed in the thin SOI layer. The insulating layer eliminates junction capacitance, which ordinarily exists for devices that are formed in a bulk substrate. In such way, devices formed in SOI substrates generally exhibit greater performance than comparable devices provided in bulk substrates.

However, one obstacle to greater acceptance of SOI technology is increased cost of manufacturing SOI wafers on which to form semiconductor devices. Two main technologies exist for fabricating SOI wafers. One is known as a "separation by implantation of oxygen" (SIMOX) process. In a SIMOX process, the buried oxide layer is formed by implanting a relatively thick (100 nm to 300 nm) region below the substrate surface with oxygen ions and thereafter annealing the substrate to convert the implanted region to an oxide. Among drawbacks of a SIMOX process is cost, since the cost of implantation equipment and the amount time per wafer are both significant. SIMOX processing also requires a relatively long duration anneal at high temperature to convert the oxygen-implanted region to an oxide, which also adds to the cost of fabricating SOI wafers by a SIMOX process. The incidence of defects in SIMOX wafers is another obstacle to greater acceptance of SOI wafers fabricated by a SIMOX process.

Another competing technology for making SOI wafers is known as bonding. In bonding methods, a bond wafer having an oxide layer disposed at the surface is bonded to a base wafer with the oxide layer facing the base wafer. The bond wafer is then typically ground or polished down to a desired final thickness, which remains as the SOI layer of the SOI wafer. One particular drawback of bonding methods is difficulty in reducing the thickness of the bond wafer to the desired final thickness. A typical 300 mm diameter wafer has an initial thickness of about 800 µm. On the other hand, the desired final thickness of the SOI layer is about 250 nm or less, and is more often less than 100 nm for current mainstream SOI devices. Thus, almost all of the bond wafer must be removed to complete the bonded SOI wafer. With so much of the SOI wafer to remove, it would be desirable to use a high-speed technique having a high rate of removing material. However, when a high removal rate is used, it may be difficult to avoid accidentally removing too much material and to obtain a high quality SOI layer of uniform thickness at completion.

SUMMARY OF THE INVENTION

According to an aspect of the invention, a bonded SOI wafer and a method for forming a bonded SOI wafer are provided. According to the disclosed method, a first semiconductor wafer is provided, having a first dielectric layer disposed at an outer surface of the first wafer and a plurality of dielectric filled trenches extending from the outer surface inwardly into the semiconductor. The outer surface of the first wafer is bonded to the outer surface of a second semiconductor wafer to form a bonded wafer having a bulk semiconductor region, a buried dielectric layer overlying the bulk semiconductor region, and a semiconductor-on-insulator layer overlying the buried dielectric layer, with the dielectric filled trenches extending upwardly from the buried dielectric layer into the semiconductor-on-insulator layer. The thickness of the semiconductor-on-insulator layer is then reduced until uppermost surfaces of at least some of the dielectric filled trenches are at least partially exposed.

In a particular embodiment, a plurality of dielectric filled trenches extend downwardly from an outer surface of the SOI layer, the trenches having a reentrant shape as viewed from the outer surface.

According to another aspect of the invention, a method is provided for fabricating an integrated circuit including a plurality of active devices formed in a semiconductor-on-insulator wafer. Such method includes providing a first semiconductor wafer having a first dielectric layer disposed at an outer surface of the first wafer and a plurality of dielectric filled trenches extending from the outer surface inwardly into the semiconductor. The outer surface of the first wafer is bonded to a second semiconductor wafer to form a bonded wafer having a bulk semiconductor region, a buried dielectric layer overlying the bulk semiconductor region, and a semiconductor-on-insulator layer overlying the buried dielectric layer, such that the dielectric filled trenches extend upwardly from the buried dielectric layer into the semiconductor-on-insulator layer. A thickness of the semiconductor-on-insulator layer is then reduced until uppermost surfaces of at least some of the dielectric filled trenches are at least partially exposed. Active devices are formed in the semiconductor-on-insulator layer, wherein at least some of the dielectric filled trenches function as isolation regions for the active devices.

DETAILED DESCRIPTION

The above-discussed challenges of the prior art are addressed according to the embodiments of the invention described herein. According to certain embodiments, a structure and method of fabricating bonded SOI wafers is provided in which trench isolation structures formed in a bond wafer are used to determine the final thickness of the SOI wafer. The trench isolations, especially shallow trench isolation (STI) regions used in particular embodiments of the invention enable the SOI layer of the wafer to have uniform thickness while providing good process control over the thickness of the SOI layer. The presence of the STI regions in the bond wafer provides an endpoint control for stopping the silicon removal process in the various processes disclosed herein. In addition, the process disclosed herein may help to reduce an incidence of defects.

A particular benefit of the process according to some embodiments of the invention is the ability to form at least some of the STI regions of the final device layer structure during earlier processing used to form the SOI wafer.

Figure 1:
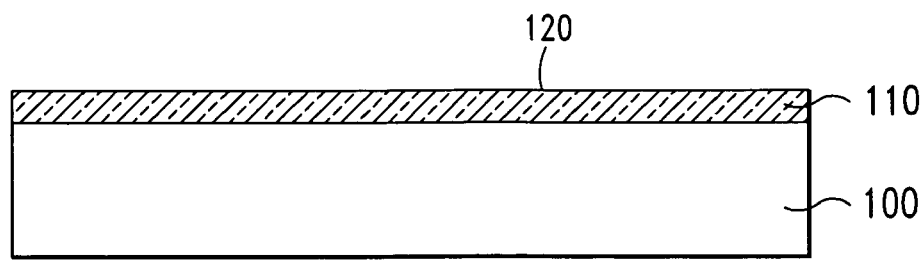
FIGS. 1 though 7 illustrate stages in fabrication of an SOI wafer according to one embodiment of the present invention.

A first method of forming a bonded SOI wafer according to an embodiment of invention will now be described with reference to FIGS. 1 through 7. FIG. 1 is a sectional view illustrating an initial stage in fabricating an SOI wafer. As illustrated in FIG. 1, a dielectric layer 110 is formed at an outer surface 120 of a first wafer 100, the wafer consisting essentially of a semiconductor such as single-crystal silicon. In a particular embodiment, the dielectric layer 110 consists essentially of an oxide having a thickness preferably between about 20 nm and about 200 nm, more preferably between about 30 nm and about 150 nm, and most preferably about 50 nm. Alternatively, the dielectric layer 110 may consist of multiple layers such as a nitride layer overlying an oxide layer. The dielectric layer 110 is provided by any of several well-known processes such as thermal oxidation, deposition of a doped or undoped silicate glass, e.g., boro-phospho-silicate glass, low-temperature deposition techniques such as spin-on-glass deposition followed by subsequent densification by heating, deposition from a tetraethylorthosilicate (TEOS) precursor, atomic layer deposition (ALD), plasma enhanced chemical vapor deposition (PECVD), rapid thermal chemical vapor deposition (RTCVD), and higher temperature processes such as low-pressure chemical vapor deposition (LPCVD) and high-density plasma deposition.

Figure 2:
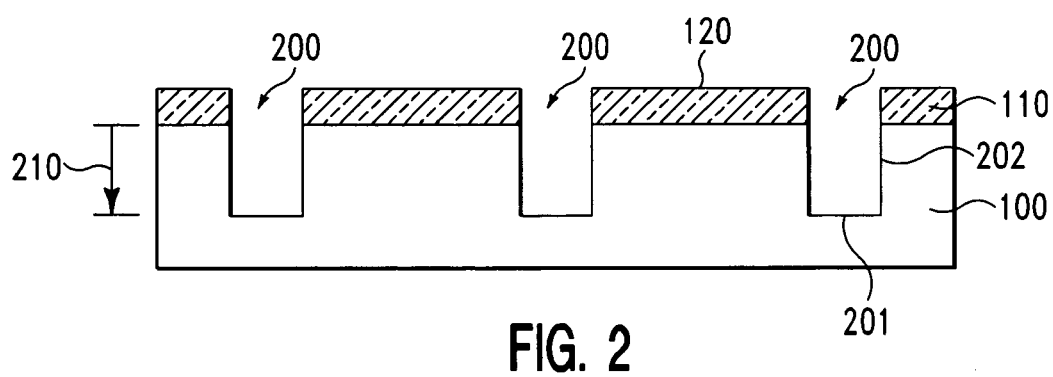

FIG. 2 illustrates a subsequent stage of processing in which the dielectric layer 110 is patterned and the pattern is transferred to the underlying silicon by etching to provide a plurality of trenches 200 which extend from the outer surface 120 into the silicon 100 of the wafer. In one embodiment, the trenches are shallow, being etched to a depth 210 into the substrate of between 20 nm and about 200 nm, preferably between about 30 nm and about 150 nm, and more preferably between about 50 nm and about 100 nm. As shown, the etched trenches are formed to have a bottom 201 and at least one sidewall 202.

Figure 3A:
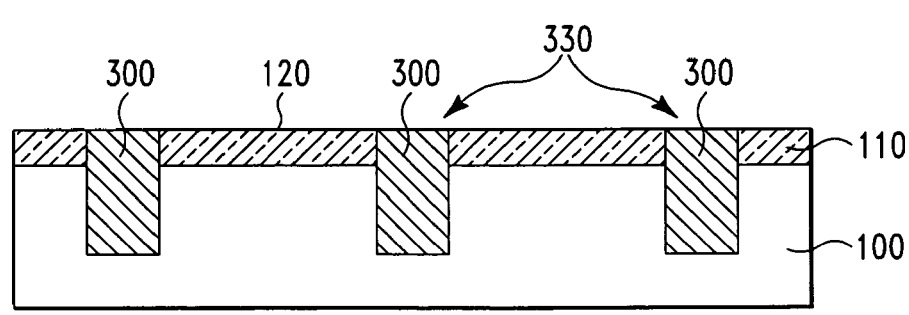

Thereafter, a further deposition is conducted to fill the trenches 200 with a dielectric 300, as shown in FIG. 3A. The dielectric 300 can be such as the various materials described above which are used to form the dielectric layer 110. However, when the STI region is used to provide actual device isolation in the final SOI wafer, an especially preferred dielectric material for its properties is an oxide deposited by a high-density plasma technique.

The resulting structure is then planarized through a technique such as chemical-mechanical polishing (CMP), to planarize the outer surface 120 of the resulting structure. In one embodiment, the dielectric 300 is a layer of oxide. The completed STI regions are hereinafter referenced as 330.

Figure 3B:
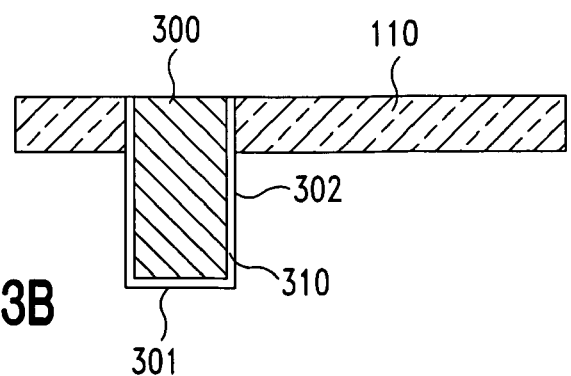

In a particular embodiment shown in FIG. 3B, the dielectric 300 is deposited into the trenches only after a liner layer 310 containing, for example, a layer of thermally formed silicon oxide, and/or a layer of silicon nitride, is provided on the sidewalls 302 and bottoms 301 of the trenches. The silicon nitride layer, if present, will act as a planarization stopping layer and protect the underlying dielectric layer 110 from being damaged. Preferably, the liner layer 310 consists of a thermally grown silicon oxide having a thickness preferably between about 5 nm and about 15 nm, and a nitride layer having a thickness preferably between about 5 nm and about 15 nm. The nitride layer is preferably formed by LPCVD process. Alternatively, other suitable processes, such as PECVD, RTCVD, ALD, can be used for forming the silicon nitride layer.

Figure 3C:
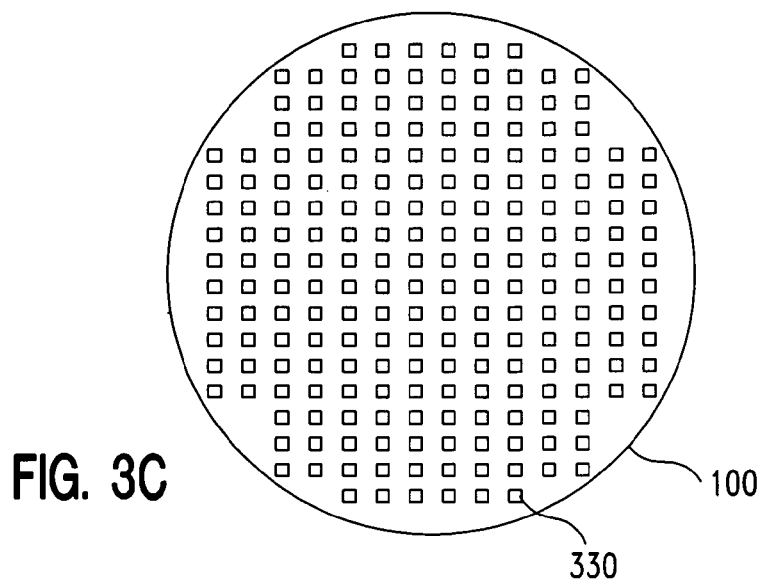

FIG. 3C provides a top down illustration corresponding to the stage of fabrication shown in FIG. 3A. As illustrated, dielectric filled STI regions 330 are shown disposed at locations throughout the surface of the wafer 100.

Figure 4:
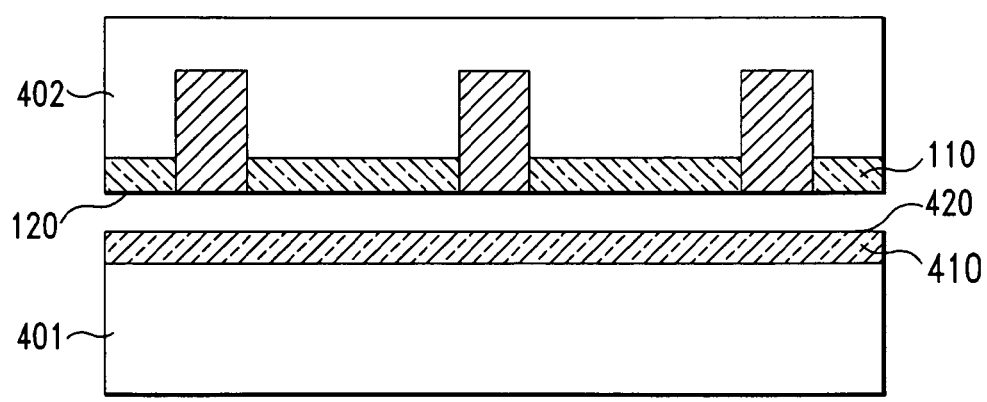
Figure 5:
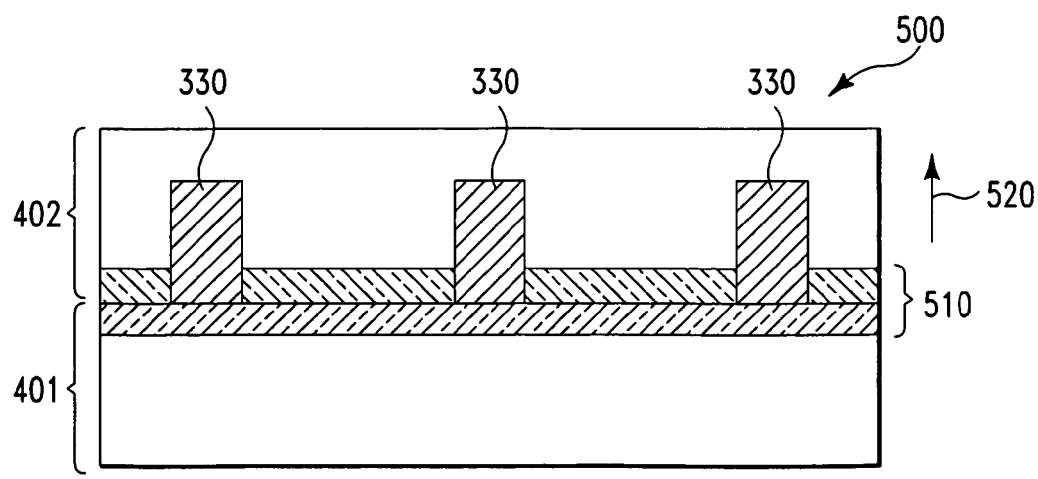

Thereafter, as shown in FIG. 4, a second semiconductor wafer 401, referred to herein as a base wafer, and consisting essentially of single crystal silicon, is aligned to the first wafer, which is referenced hereinafter as the bond wafer 402. An optional dielectric layer 410, preferably consisting essentially of an oxide, is formed at an outer surface 420 of the base wafer 401. The oxide layer 410 can be formed by any of processes described above for forming the dielectric 110. The oxide layer 410, if present, has a thickness preferably between about 20 nm and about 200 nm, more preferably between about 30 nm and about 100 nm, and most preferably about 50 nm.

As shown in FIG. 4, the two wafers 401 and 402 are aligned with each other, with the dielectric layer 110 disposed at the outer surface 120 of the bond wafer juxtaposed to the dielectric layer 410 disposed at the outer surface 420 of the base wafer. Thereafter, the two wafers are bonded together, such as by an adhesive or by heating of the two wafers to melt and bond the oxides present at the outer surfaces of each of the wafers. In the resultant structure 500 shown in FIG. 5, the two wafers appear as a single bonded structure formed from the two wafers 401, 402, having a dielectric layer 510 and STI regions 330 extending in a direction 520 upwardly therefrom.

Figure 6:
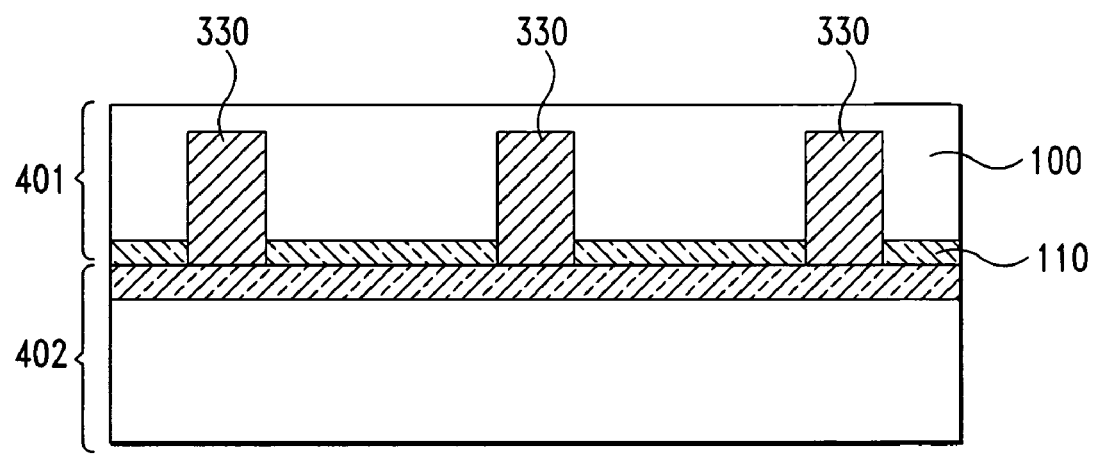

Thereafter, as shown in FIG. 6, the height of the silicon 100 is recessed using a removal technique to remove the silicon to almost its final height. For example, when the bond wafer has a thickness of 800 μm and the height is to be recessed to a final height of 300 nm (0.3 μm) including the thickness of the oxide layer 110 and the STI regions 330, in one example, the grinding process is performed until all but the last 0.5 μm of the silicon layer 100 remains. Preferably, a high removal rate technique is used in this step, the technique including a timed grinding process, for example. When a timed process is used for this step, the process should be controlled with a wide margin of error to avoid possible over-removal with potentially damaging effects to the SOI layer of the final structure.

Figure 7:
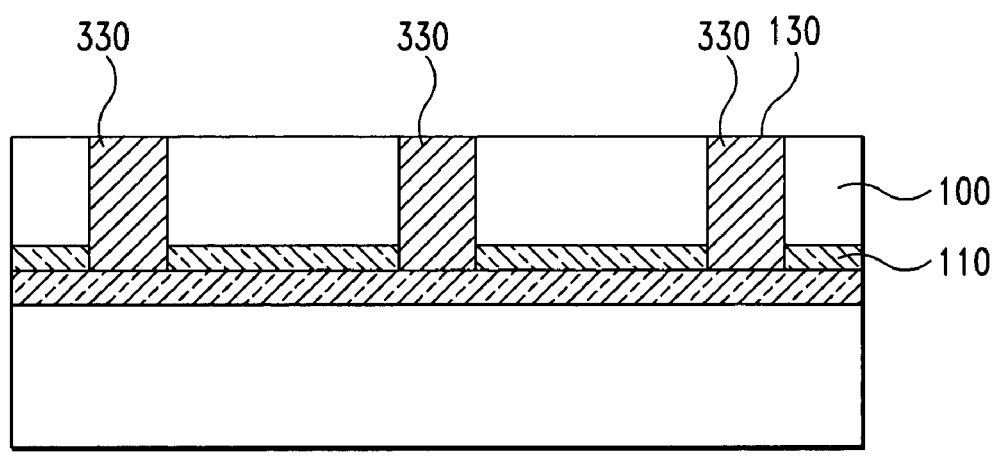

Thereafter, as shown in FIG. 7, the final thinning of the SOI layer 100 to the final height is performed by a higher precision removal process, which may be performed at a lower removal rate because there is now less silicon material to be removed. In this step, the SOI layer 100 is thinned using a chemical mechanical polishing (CMP) process, using the STI regions 330 to endpoint the CMP process. A monitor can be provided for detecting when the hidden STI regions are first exposed during the CMP process, such as by detecting a chemical that first appears in the effluent of the CMP process when the uppermost surfaces 130 of the STI regions 330 are first exposed.

In an alternative embodiment of the invention, the final planarization is conducted by an etching technique instead of the CMP technique. In one embodiment, a dry etching technique, e.g., a reactive ion etch or plasma etch, is used to recess the SOI layer 100 to the final thickness. As before, the STI oxide acts as an endpoint on which to stop the silicon dry etching process to control the final thickness of the SOI layer. Finally, an optional anneal process may be performed in an environment containing hydrogen or deuterium to further flatten the SOI surface by reflowing silicon at a temperature above 800° C. Such an anneal process, when performed, also helps improve characteristics of the interface between the STI regions 330 and the SOI regions 100.

Figure 8:
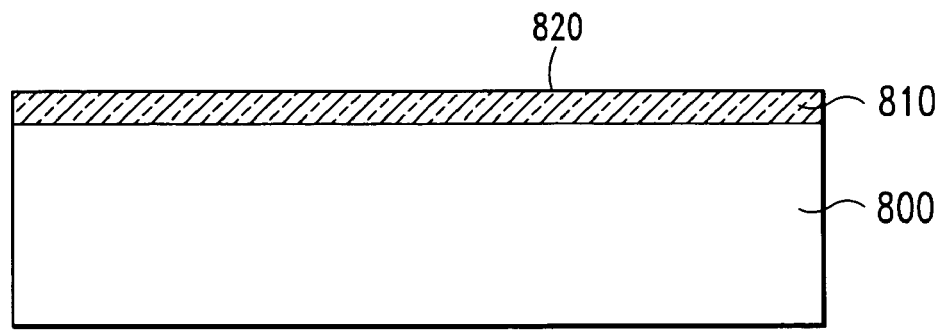
FIGS. 8 through 15 illustrate stages in fabrication of an SOI wafer according to an alternative embodiment of the present invention.

A second method of forming a bonded SOI wafer according to an embodiment of invention will now be described with reference to FIGS. 8 through 14. FIG. 8 is a sectional view illustrating an initial stage in fabricating an SOI wafer according to one embodiment of the present invention and is similar to the wafer shown in FIG. 1. As illustrated in FIG. 8, a dielectric layer 810 is formed at an outer surface 820 of a first wafer 100, the wafer consisting essentially of a semiconductor such as single-crystal silicon. In a particular embodiment, the dielectric layer 810 consists essentially of an oxide with a thickness of preferably between about 20 nm and about 200 nm, more preferably between about 30 nm and about 150 nm, and most preferably about 50 nm. Alternatively, the dielectric layer 810 may consist of multiple layers such as a nitride layer overlying an oxide layer. As before, the dielectric layer 810 is provided by any of several well-known processes such as thermal oxidation, deposition of a doped or undoped silicate glass, e.g., boro-phospho-silicate glass, low-temperature deposition techniques such as spin-on-glass deposition followed by subsequent densification by heating, deposition from a tetraethylorthosilicate (TEOS) precursor, atomic layer deposition (ALD), plasma enhanced chemical vapor deposition (PECVD), rapid thermal chemical vapor deposition (RTCVD), and higher temperature processes such as low-pressure chemical vapor deposition (LPCVD) and high-density plasma deposition.

Figure 9:
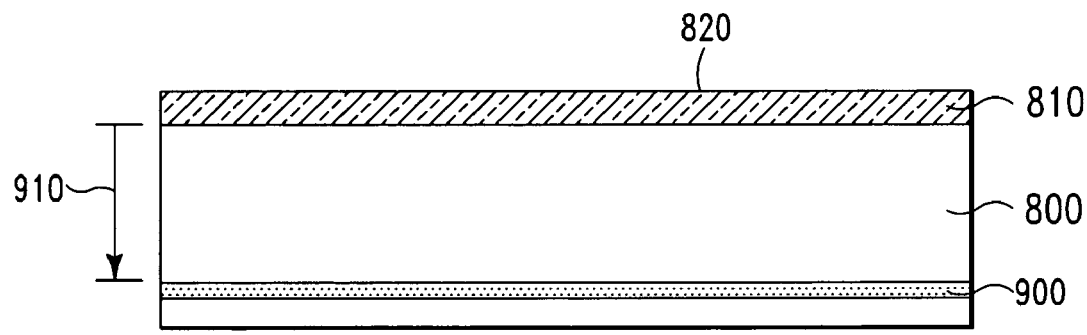

FIG. 9 illustrates a stage of processing in which a delaminating layer 900 is provided in the wafer 800. The delaminating layer 900 can be formed either before or after the dielectric layer is formed. In a preferred embodiment, an ion implantation process is used to form the delaminating layer 900. This ion implantation forms a region which is susceptible to delamination during later processing, as will be described further below. During this process, hydrogen (H) or noble gas ions, in this case preferably helium (He) or argon (Ar) ions, are implanted into the bond wafer through surface 820 to form a delaminating layer within the interior of the wafer 800. During subsequent bonding of the bond wafer to the base wafer, heat may be applied. As a result of that subsequent treatment, the SOI layer separates from the rest of the wafer at the delaminating layer 900. This process is particularly advantageous in reducing raw material use since the wafer that is separated from the SOI layer during this subsequent treatment can be used again as a bond wafer to make another bonded SOI wafer.

Figure 10:
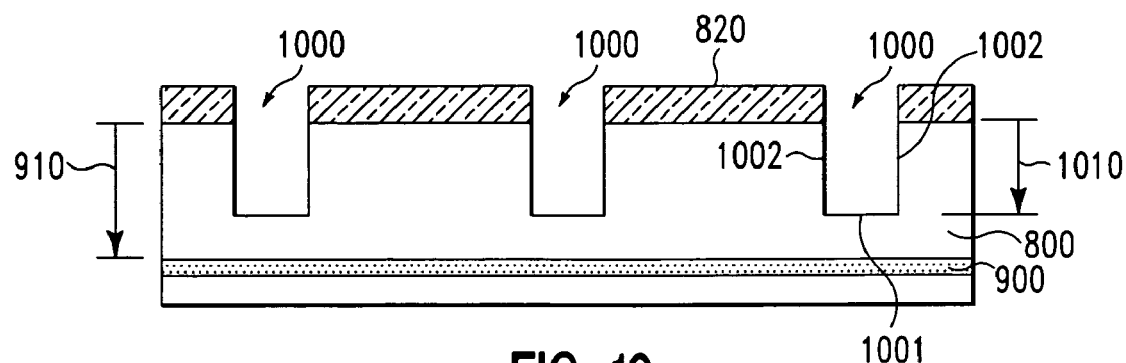

FIG. 10 illustrates a subsequent stage of processing in which the dielectric layer 810 is patterned and the pattern is transferred to the underlying silicon by etching to provide a plurality of trenches 1000 which extend from the outer surface 820 into the silicon 800 of the wafer. In one embodiment, the trenches are shallow, being etched to a depth 1010 into the substrate of between about 20 nm and about 200 nm, which is not as deep as the depth of the delaminating layer 900. As before, the etched trenches are formed to have a bottom 1001 and at least one sidewall 1002.

Figure 11:
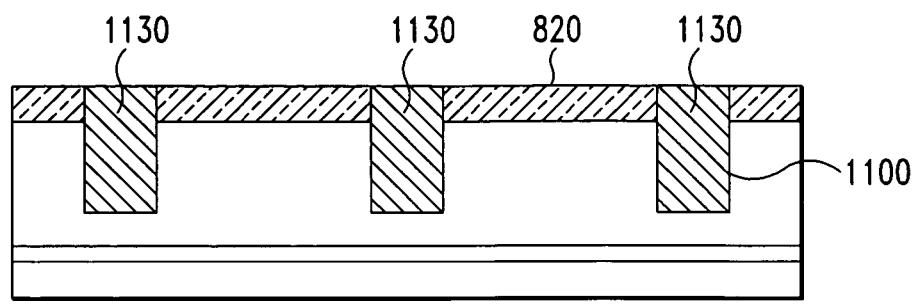

Thereafter, a further deposition is conducted to fill the trenches 1000 with a dielectric 1100, as shown in FIG. 11. The dielectric 1100 can again be such as the various materials described above which are used to form the dielectric layer 810. However, when the STI region is used to provide actual device isolation in the final SOI wafer, an especially preferred dielectric material for its properties is an oxide deposited by a high-density plasma technique.

The resulting structure is then planarized through a technique such as chemical-mechanical polishing (CMP), to planarize the outer surface 820 of the resulting structure. In one embodiment, the dielectric 1100 is a layer of oxide. The completed STI regions are hereinafter referenced as 1130.

As in the embodiment described above with reference to FIGS. 1-7, in an alternative form of this embodiment, the dielectric 1100 is deposited into the trenches only after a liner layer containing, for example, a layer of thermally formed silicon oxide, and/or a layer of silicon nitride, is provided on the sidewalls and bottoms of the trenches. The silicon nitride layer, if present, acts as a planarization stopping layer and protects the underlying dielectric layer 110 from being damaged. Preferably, the liner layer consists of a thermally grown silicon oxide having a thickness preferably between about 5 nm and about 15 nm, and a nitride layer having a thickness preferably between about 5 nm and about 15 nm. The nitride layer is preferably formed by LPCVD process. Alternatively, other suitable processes, such as PECVD, RTCVD, ALD, can be used for forming the silicon nitride layer.

Figure 12:
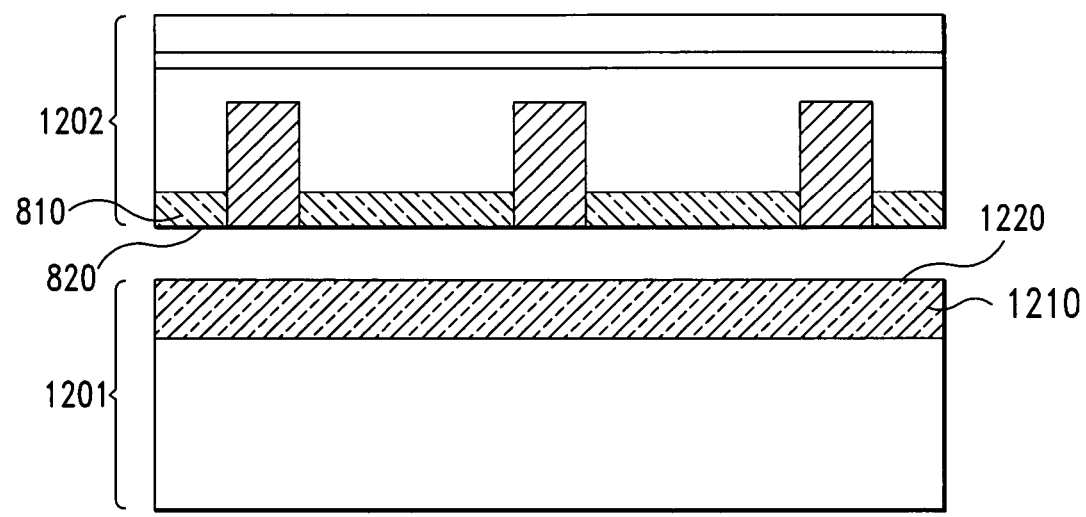

Thereafter, as shown in FIG. 12, a second semiconductor wafer, referred to herein as a base wafer 1201, and consisting essentially of single crystal silicon, is aligned to the first wafer 1202. The first wafer will be hereinafter referenced as the bond wafer 1202. A dielectric layer 1210, preferably consisting essentially of an oxide, is disposed at an outer surface 1220 of the base wafer 1201.

As shown in FIG. 12, the two wafers 1201 and 1202 are aligned to each other, with the dielectric layer 810 disposed at the outer surface 820 of the bond wafer juxtaposed to the dielectric layer 1210 disposed at the outer surface 1220 of the base wafer.

Figure 13:
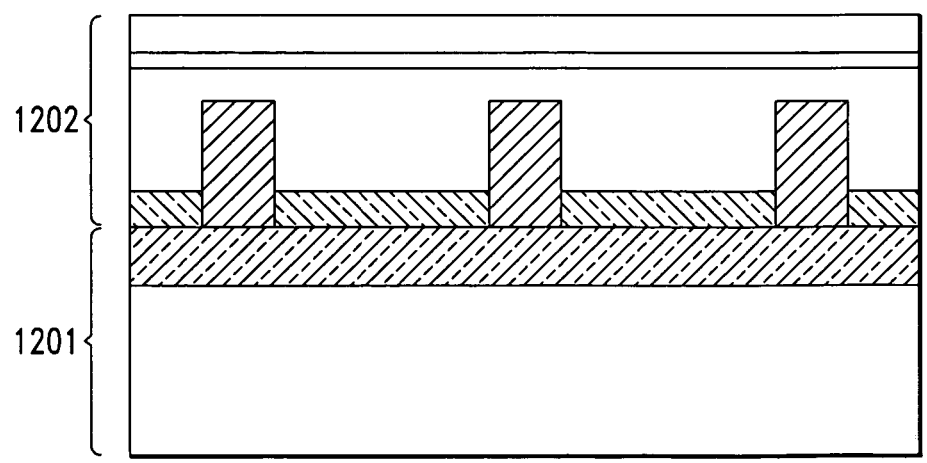

Thereafter, the two wafers 1201, 1202 are bonded together, preferably by heating, as shown in FIG. 13. During the bonding process, heat treatment causes the crystal rearrangement of the hydrogen or noble gas ions, leading to bubble cohesion and separation of the bond wafer 1202 from the SOI layer 800 at the delaminating layer 900, as shown in FIG. 14.

Figure 14:
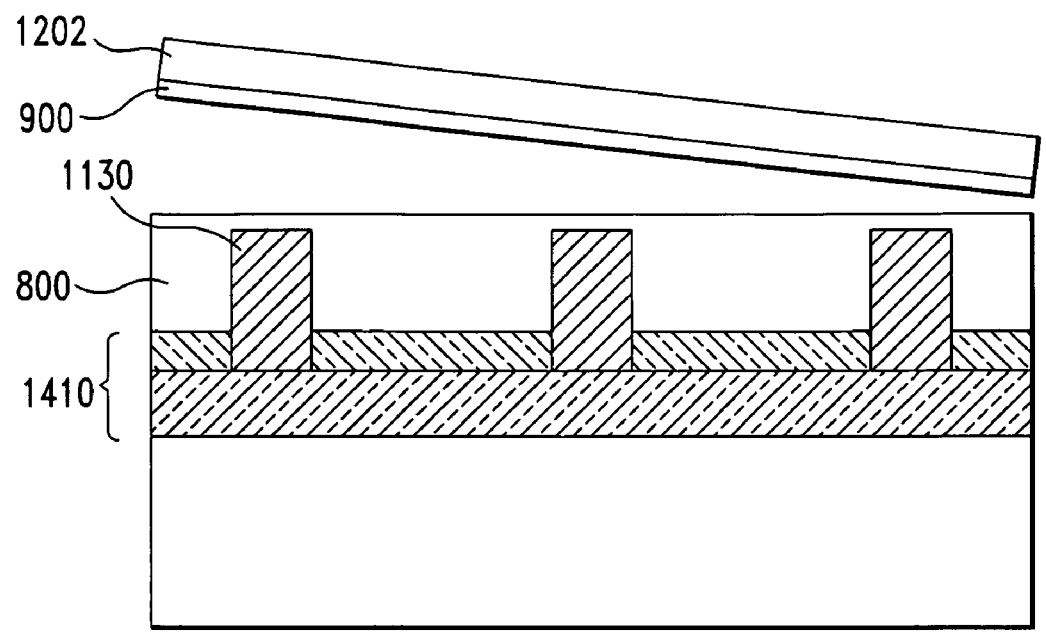

As further shown in FIG. 14, a single bonded SOI wafer is formed from the two wafers, having a buried dielectric layer 1410 and STI regions 1130 extending upwardly therefrom.

Figure 15:
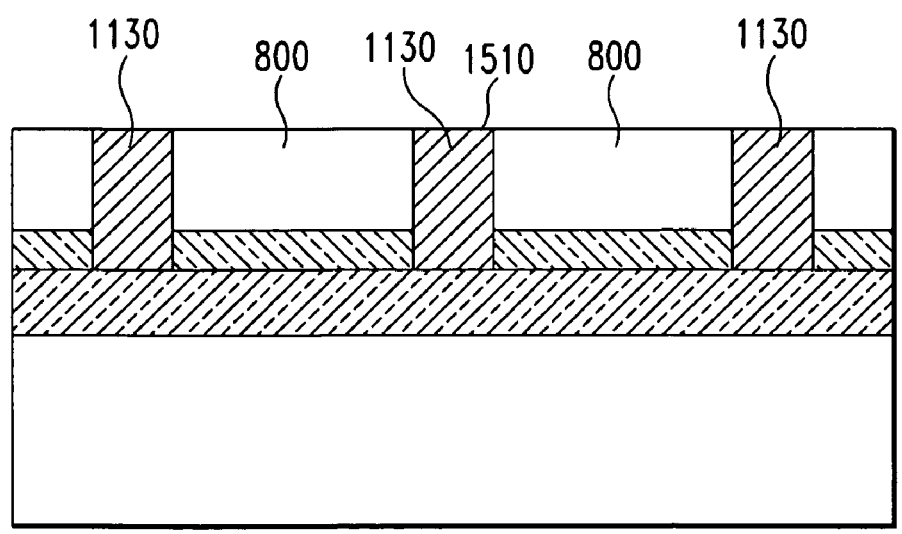

Thereafter, as shown in FIG. 15, the thinning of the SOI layer 800 to the final thickness is performed by a higher precision removal process, using the STI regions 1130 to endpoint the process. In one embodiment, the reduction to the final thickness is performed by CMP. In an alternative embodiment, the reduction of the SOI layer 800 to final thickness is performed by etching, e.g. by a dry etch of silicon, the etching being endpointed upon reaching the level of the top surface 1510 of at least some of the STI regions 1130.

Figure 16:
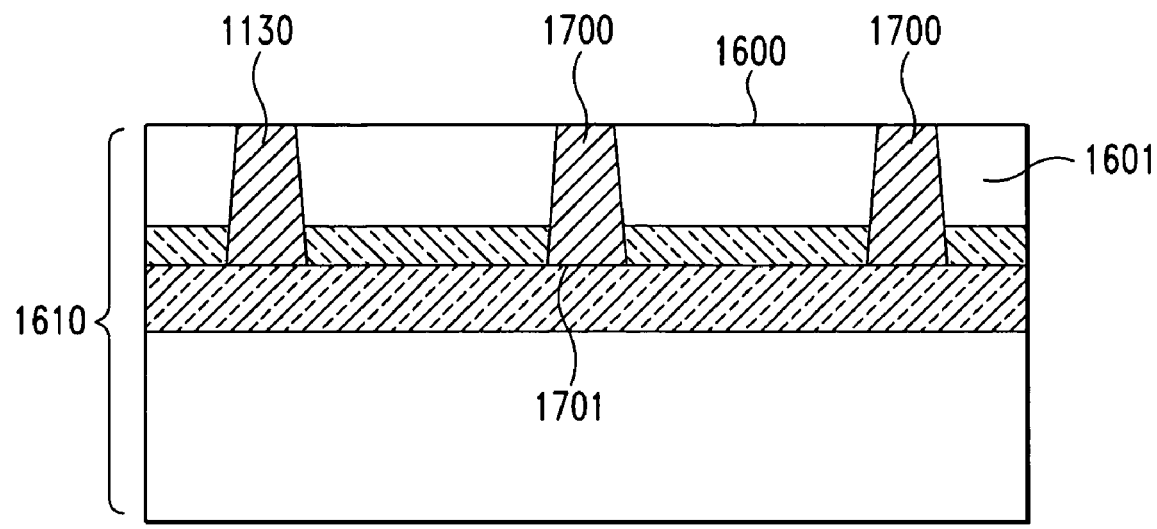
FIG. 16 shows a resultant structure as per one embodiment of the present invention having an shallow trench isolation (STI) with a reentrant shape.
Figure 17:
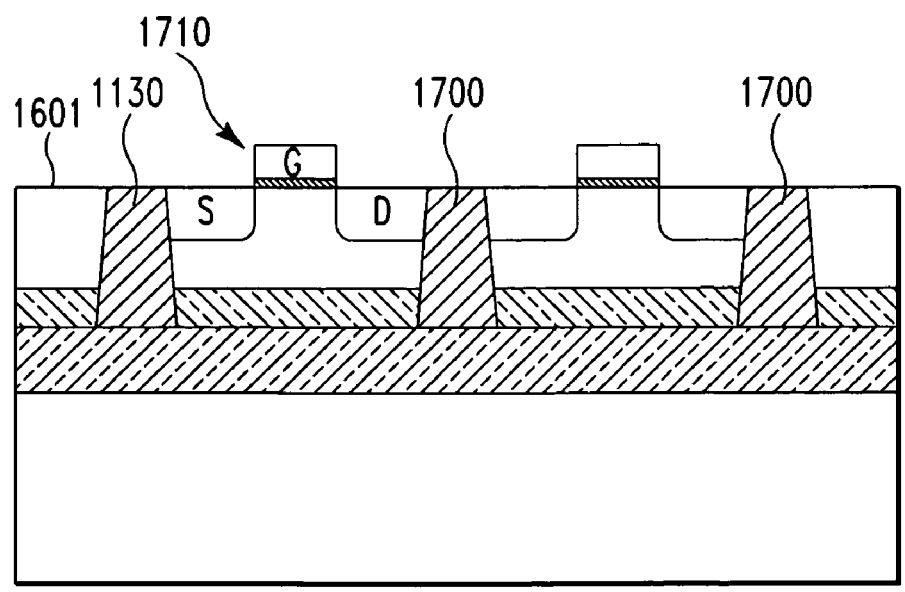
FIG. 17 shows an embodiment including a device disposed among reentrant shape STI regions according to the embodiment shown in FIG. 16.

FIGS. 16 and 17 illustrate a further embodiment of the invention. In the embodiment shown in FIG. 16, a bonded SOI wafer 1610 includes a plurality of dielectric filled trenches 1700 extending downwardly from an outer surface 1600 of the SOI layer 1601 and having a reentrant shape as viewed from the outer surface. These dielectric filled trenches 1700 are available for use as shallow trench isolation regions (STI regions) in the completed bonded SOI wafer 1610. It should be noted that FIG. 16 shows the resulting structure after bonding of the base wafer to the bond wafer and subsequently thinning the SOI layer 1601. Either of the methods described above in relation to FIGS. 1 through 7 or 8 through 15 can be used to fabricate the SOI wafer including the reentrant shape trenches 1700 shown in FIG. 16.

The reentrant shape trenches 1700 have a diameter that increases from a top surface provided at the outer surface 1600 of the SOI wafer 1610 to a thicker end 1701 disposed at the bottom of the SOI layer 1601. Since the STI trenches are filled before bonding, the reentrant shape of the STI trenches enables void-free filling of the STI trenches.

FIG. 17 illustrates a device 1710 formed in the SOI layer of the bonded semiconductor-on-insulator wafer 1610 having STI regions 1700. Illustratively, a gate (G), source (S), and a drain (D) of the device 1710 are shown as referenced. The void-free STI fill resulting from the reentrant shape of the STI regions improves device performance and reliability. It also reduces defects in the filling of the STI regions and improves product yield.

Finally, an optional anneal process may be performed in an environment containing hydrogen or deuterium to further flatten the SOI surface by reflowing silicon at a temperature above 800° C. Such optional anneal process, when performed, helps improve the characteristics of the interface between the STI regions 1700 and the SOI regions 1601.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A bonded semiconductor-on-insulator wafer, comprising:
   a bulk single-crystal semiconductor layer;
   a buried dielectric layer overlYing said bulk single-crystal semiconductor layer,
   said buried dielectric layer including at least one layer consisting essentially of silicon nitride and at least one layer consisting essentially of an oxide of silicon;
   a single-crystal semiconductor-on-insulator (SOI) layer overlYing said buried dielectric layer; and
   a plurality of trenches extending downwardly from an outer surface of said single-crystal SOI layer, said trenches having a reentrant shape as viewed from said outer surface, said trenches filled with a dielectric layer.

2. The bonded semiconductor-on-insulator wafer as claimed in claim 1, wherein each of said trenches includes a dielectric liner lining walls of each trench, said dielectric layer overlYing said dielectric liner.

3. The bonded semiconductor-on-insulator wafer as claimed in claim 2, wherein said dielectric liner includes at least one material selected from the group consisting essentially of a thermally formed nitride, a deposited nitride and a thermally formed oxide.

4. The bonded semiconductor-on-insulator wafer as claimed in claim 3, wherein said dielectric liner includes a thermally formed oxide and a deposited nitride overlYing said thermally formed oxide.

5. A bonded semiconductor-on-insulator wafer, comprising:
   a bulk single-crystal semiconductor layer;
   a buried dielectric layer overlYing said bulk single-crystal semiconductor layer, said buried dielectric layer including at least one layer consisting essentially of silicon nitride and at least one layer consisting essentially of an oxide of silicon;
   a single-crystal semiconductor-on-insulator (SOI) layer overlYing said buried dielectric layer;
   a plurality of trenches extending downwardly from an outer surface of said single-crystal SOI layer, said trenches having a reentrant shape as viewed from said outer surface, said trenches filled with a dielectric layer; and
   a semiconductor device having an active region disposed in said single-crystal semiconductor-on-insulator (SOI) layer.

6. The bonded semiconductor-on-insulator wafer as claimed in claim 5, wherein said active region extends from one of said dielectric-filled trenches to another one of said dielectric-filled trenches adjacent thereto.

7. The bonded semiconductor-on-insulator wafer as claimed in claim 6, wherein said active region includes a source and a drain, said source abutting said one dielectric-filled trench and said drain region abutting said other dielectric-filled trench adjacent thereto.

8. The bonded semiconductor-on-insulator wafer as claimed in claim 7, further comprising a gate overlYing a portion of said single-crystal SOI layer between said source and said drain.

* * * * *